United States Patent [19]

Zibu

[11] 4,447,892
[45] May 8, 1984

[54] PRE-CHARGE FOR THE BIT LINES OF A RANDOM ACCESS MEMORY

[75] Inventor: Mitsuo Zibu, Ueno, Japan

[73] Assignee: Sharp Kabushiki Kaisha, Osaka, Japan

[21] Appl. No.: 516,195

[22] Filed: Jul. 22, 1983

Related U.S. Application Data

[63] Continuation of Ser. No. 234,840, Feb. 13, 1981, abandoned.

[30] Foreign Application Priority Data

Feb. 13, 1980 [JP]  Japan ................................. 55-17068

[51] Int. Cl.³ ........................ G11C 7/00; G11C 11/34
[52] U.S. Cl. ................................. 365/156; 365/189; 365/203
[58] Field of Search ............... 365/154, 156, 181, 182, 365/189, 191, 195, 203

[56] References Cited

U.S. PATENT DOCUMENTS

| | | | |
|---|---|---|---|
| 4,112,506 | 9/1978 | Zibu | 365/181 |
| 4,131,951 | 12/1978 | Asahi | 365/203 |
| 4,150,441 | 4/1979 | Ando | 365/203 |
| 4,281,400 | 7/1981 | Schanzer et al. | 365/203 |

OTHER PUBLICATIONS

U.S. P.T.O. Classification Definitions Class 365 Jan. 78 p. 365-21 Subclass 203.

*Primary Examiner*—George G. Stellar
*Attorney, Agent, or Firm*—Birch, Stewart, Kolasch & Birch

[57] ABSTRACT

A random access memory comprises an array of a plurality of storing locations, address signal lines for addressing the plurality of storing locations, a data signal line commonly coupled to said plurality of storing locations for inputting or outputting data signals, each said location comprising an output inverter circuit having the output connected to the data signal line, a first switching element, coupled to the output inverter circuit, which is placed in nonconductive states in a writing operation mode of the random access memory, and a second switching means connected to the data signal line for receiving pre-charge signals in synchronization with access signals held on the address signal line so that the data signal line is precharged prior to a reading operation mode of the random access memory.

3 Claims, 6 Drawing Figures

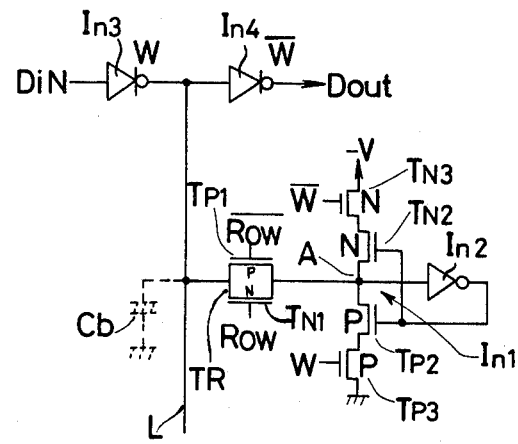
PRIOR ART  FIG. 1
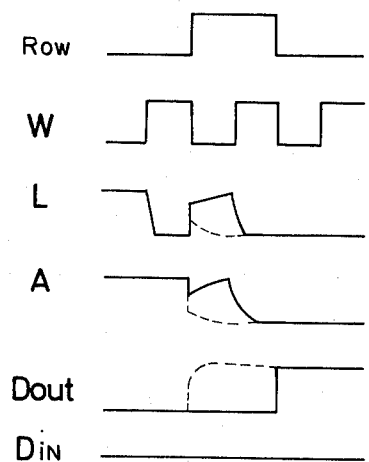
PRIOR ART  FIG. 2
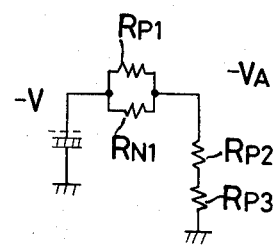
PRIOR ART  FIG. 3

PRE-CHARGE FOR THE BIT LINES OF A RANDOM ACCESS MEMORY

This application is a continuation of application Ser. No. 234,840 filed on Feb. 13, 1981 now abandoned.

BACKGROUND OF THE INVENTION

The present invention relates to a random access memory (RAM) and, more particularly, a pre-charge circuit for bit lines of RAM.

The present inventor has developed a RAM circuit as disclosed in Zibu, U.S. Pat. No. 4,112,506 issued Sept. 5, 1978, entitled "RANDOM ACCESS MEMORY USING COMPLEMENTARY FIELD EFFECT DEVICES", the disclosure of which is incorporated herein by reference.

FIGS. 1 through 3 and 6 disclose the prior art as disclosed in that patent. With reference to FIG. 1, which is simplified from the patent figure the prior art circuit mainly comprised an inverter circuit $I_{n1}$ and switching elements $T_{N3}$ and $T_{P3}$ connected between a $-V$ source voltage and the ground. Writing timing signals W and $\overline{W}$ are applied to the switching elements $T_{N3}$ and $T_{P3}$.

FIG. 2 shows a timing chart of signals occurring in connection with the circuit of FIG. 1.

In the prior art circuit as shown in FIG. 1, conventionally, a bit line L was connected to a plurality of RAM cells so that the inherent wiring capacitance Cb of the bit line L was very greater than that of point A within each of the RAM cells. This increased the level of row address signals $R_{OW}$ to make a transmission gate TR conductive. Just after any RAM cells were selected, the voltage in the point A in one of the RAM cells selected was as follows:

$$-V_A = -V \frac{R_{P2} + R_{P3}}{R_1 + R_{P2} + R_{P3}}$$

where with reference to FIG. 3 showing an equivalent circuit to FIG. 2, $R_1$: the combined resistance of each of ON resistances $R_{P1}$ and $R_{N1}$ in each of MOS transistors $T_{P1}$ and $T_{N1}$ forming the transmission gate TR $R_{P2}$: the ON resistance of a MOS transistor $T_{P2}$ $R_{P3}$: the ON resistance of a MOS transistor $T_{P3}$ and the point A of the RAM cell was placed in the high level while the bit line L was placed in $-V$ voltage by charging the inherent capacitance CB.

Since the point A had the high voltage, it was normal for such a high level at the point A to be transmitted to the bit line L. However, transmission of this high level was prevented because of the relationship between a reversed level of a second inverter circuit $I_{n2}$ and the voltage $-V_A$ at the point A. That is, as indicated by the dotted lines of FIG. 2, the respective voltages were changed depending on their earlier conditions, to thereby destroy the voltage information stored in the RAM cell.

To prevent such a destruction, it was necessary to satisfy the following relationship between an ON resistance $R_1$ of the transmission gate TR and the two ON resistances $R_{P2}$ and $R_{P3}$ of the transistors $T_{P2}$ and $T_{P3}$ in the first inverter $I_{n1}$.

$$R_1 \gg R_{P2} + R_{P3}$$

Further, it was necessary to satisfy a similar relationship between the transmission gate TR and the two ON resistances $R_{N2}$ and $R_{N3}$ in the transistors $T_{N2}$ and $T_{N3}$ in the first inverter $I_{n1}$.

These relationships would be achieved by lowering the respective ON resistances $R_{P2}$, $R_{P3}$, $R_{N2}$ and $R_{N3}$ of the MOS transistors $T_{P2}$, $T_{P3}$, $T_{N2}$ and $T_{N3}$, respectively. To this end, the sizes of the respective transistors became large to a disadvantageous extent. When the ON resistance $R_1$ of the transmission gate TR became great, access time was increased which was also disadvantageous.

Conventionally, these factors were defined by considering what access time for the RAM was necessary and what sizes of the RAM were permitted. Therefore, a circuit design of the RAM cell was very complicated and even through this complicated circuit design, a suitable circuit was never obtained which desirably satisfied the both factors.

SUMMARY OF THE INVENTION

Accordingly, it is an object of the present invention to provide an improved RAM circuit.

It is another object of the present invention to provide an improved RAM circuit with a pre-charge circuit added to a bit line to ensure stable access operation of the RAM.

Briefly described, a random access memory of the present invention comprises an array of a plurality of storing locations, address signal lines for addressing the plurality of storing locations, a data signal line commonly coupled to said plurality of storing locations for inputting/outputting a data signal, each said location comprising an output inverter circuit having the output connected to the data signal line, a first switching element, coupled to the output inverter circuit, which is placed in nonconductive states in a writing operation mode of the random access memory, and a second switching means connected to the data signal line for receiving pre-charge signals in synchronization with access signals held on the address signal line so that the data signal line is pre-charged prior to a reading operation mode of the random access memory.

BRIEF DESCRIPTION OF THE DRAWINGS

The present invention will become more fully understood from the detailed description given hereinbelow and the accompanying drawings which are given by way of illustration only, and thus are not limitative of the present invention and wherein:

FIGS. 1 through 3 show the prior art techniques as disclosed in U.S. Pat. No. 4,112,506;

DESCRIPTION OF THE INVENTION

A RAM circuit coupled to a pre-charge circuit of the present invention is summarized as follows:

A random access memory using complementary field effect transistors, comprising an array of a plurality of storing locations, address signal lines for addressing said plurality of storing locations, a data signal line commonly coupled to said plurality of storing locations for inputting/outputting a data signal, each said location comprising a flip-flop including first and second inverters cross connected to each other and each implemented by complementary field effect transistors, field effect switching transistors connected in series with said first inverter and to be non-conductive in a write operation mode, a transmission gate connected between the input/output node of said flip-flop and said data signal line to be operable as a function of the signal in said address signal line, said transmission gate comprising two complementary field effect switching transistors connected in parallel with each other, each individually responsive to the complementary states of the address signal in said address signal line, said random access memory further comprising a third inverter implemented by complementary field effect transistors and having the output connected to said data signal line, field effect switching transistors connected in series with said third inverter and to be conductive in the write operation mode, and an output circuit having the input connected to said data signal line and implemented by complementary field effect transistors.

Figure 4:
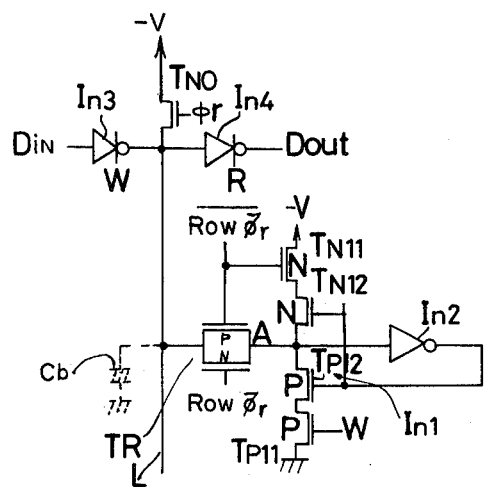
FIG. 4 shows circuit configuration of a circuit of the present invention.

With reference to FIG. 4, more particularly, the circuit of the present invention comprises a first inverter $I_{n1}$ formed by a complementary scheme, and a second inverter $I_{n2}$. The both inverters $I_{n1}$ and $I_{n2}$ are connected such that each of input lines is coupled in common and a cross connection of the pair of inverters $I_{N1}$ and $I_{N2}$ is implemented to form a flip-flop, which serves as a storing cell.

Between an output inverter $I_{n1}$ and a bit line L, a transmission gate TR is coupled which comprises two complementary field effect switching transistors connected in parallel with each other. The first inverter $I_{n1}$ comprises an N-channel MOS transistor $T_{N11}$ connected to a voltage source $-V$ and a P-channel MOS transistor $T_{P11}$ grounded. A write timing signal W is applied to the gate of the MOS transistor $T_{P11}$. A row selection signal $\overline{R_{OW}\phi_r}$ is applied to both the gate of the MOS transistor $T_{N11}$ and one of the transistors within the transmission gate TR.

A plurality of RAM cells each having the above circuit configuration are tied to a single line of the bit line L. Additionally, a write operation inverter $I_{N3}$ and a read operation inverter $I_{N4}$ are coupled to the bit line L. The inverter $I_{N3}$ receives a write signal $D_{in}$ and the inverter $I_{N4}$ generates information of the voltage on the bit line L toward an output line $D_{out}$ under control by a timing signal R.

Figure 6:
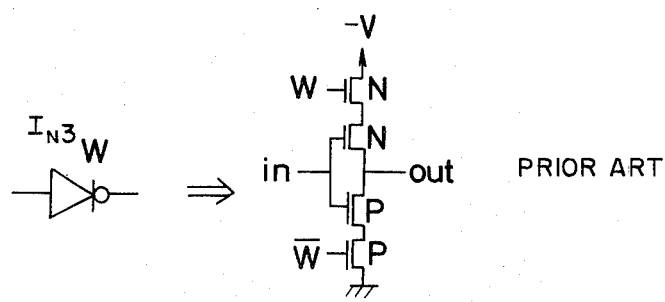
FIG. 6 shows the write operation inverter $I_{N3}$ in detail.

FIG. 6 shows a specific circuit configuration of the inverter $I_{N3}$ comprising two MOS transistors formed as a complementary scheme. The write timing signal W and $\overline{W}$ are entered to the gates of switching transistors. The inverter $I_{N4}$ has the similar circuit configuration except that the write timing signals W and $\overline{W}$ are replaced by read timing signals R and $\overline{R}$.

A pre-charge N-channel MOS transistor $T_{N0}$ is coupled between the bit line L and the voltage source $-V$. A clock signal $\phi_r$ is introduced to the gate of the transistor $T_{NO}$. The signal $\phi_r$ is formed by the timing as described below.

Figure 5:
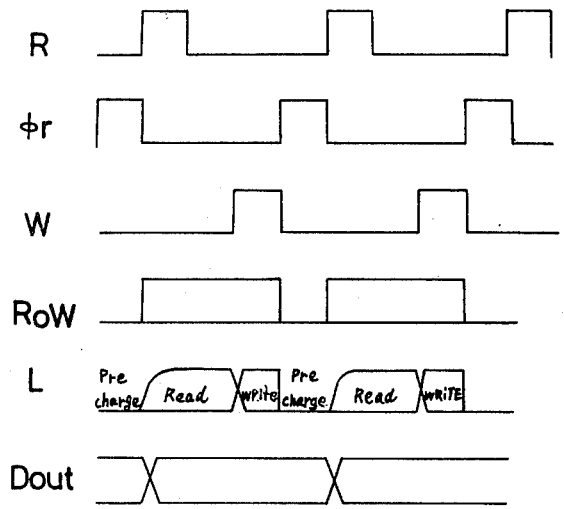
FIG. 5 shows a time chart of signals occurring within the circuit of FIG. 4.

With reference to FIG. 5 showing a time chart of the signals involved, operation of RAM will be now described.

Prior to the application of access instructions for the RAM cells, the RAM cells which are commonly connected to the bit line L are placed in nonselective states by turning the respective transmission gates off under the control of an AND output formed by a row selection signal $R_{OW}$ and the clock signal $\phi_r$ entered to a row selection line. While the transmission gates TR are off, the pre-charge transistor $T_{N0}$ is made conductive by application of the clock signal $\phi_r$. Then, the inherent capacitance Cb of the bit line L is charged up to the level of the voltage source $-V$.

Therefore, this indicates that the pre-charge of the bit line L by the clock signal for $\phi_r$ is conducted prior to access operation for writing and reading by the RAM cell. The clock signal $\phi_r$ is applied to the transistor $T_{N0}$ at the time before the reading operation or after the completion of the writing operation. This pre-charge is followed by the application of a high level row selection signal $R_{OW}$ to the row selection line of one of the RAM cells which is to be next selected. Therefore, said one of the RAM cells permits access so as to enable the reading operation.

While the row selection signal is kept at the high level, the write timing signal W fillowing the read timing signal R is entered to the switching elements of each of the inverters $I_{N3}$ and $I_{N4}$. Therefore, the information in said one of the RAM cells is read out to the output line $D_{out}$ through the bit line L and, further, the information held on the input line $D_{in}$ is received by said one of the RAM cells.

In the write and the read operations by said one of the RAM cells, prior to the access operation of said one, the bit line L is charged at the level of the source voltage $-V$. Careful attention to the values of the ON resistances of the MOS transistors prevent the destruction of the information in the RAM cell. This includes the ON resistances of the transistors $T_{P11}$ and $T_{P12}$ in the output inverter $I_{n1}$ and the transistors in the transmission gate TR. The ON resistances in the transistors $T_{P11}$ and $T_{P12}$ should be lowered and the ON resistance of the transistors of the transmission gate TR should be large.

On the other hand, no attention need be paid to the ON resistances of the MOS transistors $T_{N11}$ and $T_{N12}$. These transistors may be turned off while the RAM cell is placed in the selection state. In this example, the signal $\overline{R_{OW}\phi_r}$ is introduced to the gate of the transistor $T_{N11}$ so that it is kept off while the RAM cell is placed in the selected state. In the read operation, the two switching transistors $T_{P12}$ and $T_{N12}$ within the output inverter $I_{n1}$ are kept off so that no attention need be paid to the ratio of the resistance of output inverter $I_{n1}$ to that of the writing operation inverter $I_{n3}$.

According to the addition of the pre-charge circuit to the bit line L in terms of the present invention, easier circuit design is enabled and the size of the RAM cells becomes compact. As long as the ON resistance is remarkably lowered in the transistors $T_{P11}$ and $T_{P12}$, that of the transistors in the transmission gate TR may be accordingly lowered. Rapid read and write operations can be expected.

The type of each of the transistors whether P-channel or N-channel is used can be replaced by the other type different from the circuits of FIGS. 4 and 6.

The invention being thus described, it will be obvious that the same may be varied in many ways. Such variations are not to be regarded as a departure from the spirit and scope of the invention, and all such modifications are intended to be included witin the scope of the following claims.

What is claimed is:

1. A random access memory using complementary field effect devices and including an array of a plurality of storing locations, address signal lines for addressing said plurality of storing locations, a data signal line commonly coupled to said plurality of storing locations for inputting or outputting a data signal, each said location having a storing cell comprising:

first and second inverters cross connected to each other constructed of complementary field effect devices and having an input/output node;

first field effect switching means connected in series with said complementary field effect devices of said first inverter means for inhibiting selection of said storing cell upon receipt of a write signal during a write operation mode;

transmission gate means connected between said input/output node of said storing cell and said data signal line for enabling interconnection therebetween in response to receipt of a selection signal on said address line, said transmission gate means including two complementary parallel connected field effect switching devices, each individually responsive to a complementary state of the signal on said address line;

second field effect switching means serially connected to said complementary field effect devices of said first inverter means opposite said first field effect switching means for inhibiting application of bias power to said first inverter means upon receipt of said selection signal applied to a control terminal of said second field effect switching means;

write inverter means for presenting data to said storing cell during the write mode;

read inverter means for directing data from said storing cell during said read mode; and pre-charge switch means connected to said data signal line for receiving pre-charge signals for pre-charging said data signal line prior to a reading operation mode of said random access mamory.

2. The memory of claim 1, wherein the random access memory is constructed with a complementary field effect transistor scheme.

3. The memory of claim 1, wherein said pre-charge switch means comprises a MOS field effect transistor.

* * * * *